US006268299B1

(12) United States Patent
Jammy et al.

(10) Patent No.: US 6,268,299 B1
(45) Date of Patent: Jul. 31, 2001

(54) VARIABLE STOICHIOMETRY SILICON NITRIDE BARRIER FILMS FOR TUNABLE ETCH SELECTIVITY AND ENHANCED HYROGEN PERMEABILITY

(75) Inventors: Rajarao Jammy, Wappingers Falls; Johnathan E. Faltermeier, LaGrangeville, both of NY (US); Keitaro Imai; Ryota Katsumata, both of Yokohama (JP); Jean-Marc Rousseau, Auzeville-Tolosane (FR); Viraj Y. Sardesai, Poughkeepsie; Joseph F. Shepard, Jr., Fishkill, both of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/668,988

(22) Filed: Sep. 25, 2000

(51) Int. Cl.$^7$ .......................... H01L 21/318; H01L 21/31
(52) U.S. Cl. ............................. 438/791; 438/778
(58) Field of Search .................... 438/791, 778, 438/784, 783

(56) References Cited

U.S. PATENT DOCUMENTS

| 4,200,666 | 4/1980 | Reinberg . |
| 4,395,438 | 7/1983 | Chiang . |
| 4,855,258 | 8/1989 | Allman et al. . |
| 4,870,470 | 9/1989 | Bass, Jr. et al. . |
| 5,015,353 | 5/1991 | Hubler et al. . |
| 5,040,046 | * 8/1991 | Chhabra et al. ............... 257/635 |
| 5,578,517 | 11/1996 | Yoo et al. . |
| 5,622,596 | 4/1997 | Armacost et al. . |
| 5,811,870 | 9/1998 | Bhattacharyya et al. . |
| 5,874,368 | * 2/1999 | Laxman et al. ............... 438/794 |
| 5,939,333 | 8/1999 | Hurley et al. . |
| 6,008,086 | 12/1999 | Schuegraf et al. . |
| 6,020,243 | 2/2000 | Wallace et al. . |
| 6,040,022 | 3/2000 | Chang et al. . |
| 6,162,700 | * 12/2000 | Hwang et al. ............... 438/424 |
| 6,174,590 | * 1/2001 | Iyer et al. ............... 428/209 |
| 6,204,206 | * 3/2001 | Hurley ............... 438/791 |

* cited by examiner

Primary Examiner—Richard Elms
Assistant Examiner—Beth E. Owens
(74) Attorney, Agent, or Firm—Ratner & Prestia; H. Daniel Schnurmann

(57) ABSTRACT

A low-temperature process for forming a highly conformal barrier film during integrated circuit manufacture by low pressure chemical vapor deposition (LPCVD). The process includes the following steps. First, the process provides ammonia and a silicon-containing gas selected from the group consisting of silane, dichlorosilane, bistertiarybutylaminosilane, hexachlorodisilane, and mixtures of those compositions. The ratio of the volume of ammonia to the volume of the silicon-containing gas is adjusted to yield silicon concentrations greater than 43 atomic percent in the resultant film. The process applies a deposition temperature of 550° C. to 720° C. The ammonia and the silicon-containing gas are reacted at the deposition temperature to form a silicon-rich nitride film less than 200 Å thick. Finally, the silicon nitride film is deposited by low pressure chemical vapor deposition.

19 Claims, 7 Drawing Sheets

Stoichiometric Analysis of 2000Å LPCVD Si-Rich Nitride by Rutherford Backscattering (RBS)

| DCS/NH3 Ratio | Si (a/o) | N (a/o) | H (a/o) | Cl (a/o) |
|---|---|---|---|---|
| 1 : 1 | 43 | 53 | 4 | NA |
| 10 : 1 | 49 | 48 | 2 | 1 |
| 20 : 1 | 49 | 48 | 2 | 1 |

FIG. 4

VARIABLE STOICHIOMETRY SILICON NITRIDE BARRIER FILMS FOR TUNABLE ETCH SELECTIVITY AND ENHANCED HYROGEN PERMEABILITY

TECHNICAL FIELD

The present invention relates generally to integrated circuit manufacture and, more particularly, to a low-temperature process for depositing highly conformal silicon nitride barrier films by low pressure chemical vapor deposition (with a variable stoichiometry) to attain desired properties in the barrier films.

BACKGROUND OF THE INVENTION

A Dynamic Random Access Memory (DRAM) cell typically has a transfer device and a capacitor. The DRAM cell is so named because it can retain information only temporarily, having a retention time on the order of milliseconds, even with power continuously applied. Therefore, the cell must be read and must be refreshed at periodic intervals. Although the storage or retention time may at first appear very short, it is actually long enough to permit many memory operations between refresh cycles. The advantages of cost per bit, device density, and flexibility of use (i.e., both read and write operations are possible) have made DRAM cells the most widely used form of semiconductor memory to date.

Generally, the integrated circuit technology of a DRAM cell is based on the ability to form numerous transfer devices in a single silicon substrate. One type of transfer device is a field effect transistor (FET). There are two major types of FET: the metal-oxide-semiconductor field effect transistor or MOSFET (also called an insulated-gate FET, or IGFET), and the junction-gate field effect transistor or JFET.

A FET has a control gate, and source and drain regions formed in a substrate. The source and drain regions are conventionally formed by implanting dopant ions, such as boron, into a surface of the semiconductor substrate. The semiconductor substrate is typically made of a monocrystalline silicon containing a heavily doped p+ shallow well which is formed by ion implantation. The control gate is formed above a dielectric insulator that is deposited over the area between the source and drain regions. As voltage is applied to the control gate, mobile charged particles in the substrate form a conduction channel in the region between the source and drain regions. Thus, in a FET, a channel is induced in the surface of the silicon region between source and drain regions, and the tunneling of charges in the channel between the source and drain is controlled by a gate disposed atop the channel. Once the channel forms, the transistor turns "on" and current may flow between the source and drain regions.

The number of integrated circuits fabricated on a wafer has dramatically increased year by year. It is known that the size of each integrated circuit chip can be successfully minimized by improving the technique of integrated circuit fabrication. One method is to shorten the length of the channel in an FET. Unfortunately, shorter channels in an FET have serious drawbacks. One such drawback is the need to suppress junction leakage between the shallow well and both the source and drain. Junction leakage results in reduced retention time. The control of junction leakage becomes even more difficult as channel lengths are reduced in DRAM cells. Furthermore, future generation DRAM products will likely require lower power and fewer refresh cycles.

An important structural component used in the process of manufacturing integrated circuits is a conformal barrier or liner film. The interface between the substrate upon which the barrier film is deposited and the barrier film, at least in part, defines the isolation and dielectric characteristics of the devices utilizing the barrier film. The continuing increase in semiconductor device density has reduced the size of devices and increased their aspect ratios, making it more difficult to deposit a barrier film with the requisite conformality. In addition, it is critical that film deposition be achieved within the thermal budget. The barrier film deposition step in the manufacturing process must also minimize current leakage, which results in reduced retention time for the device.

Typically, conformal barrier films are deposited by chemical vapor deposition (CVD). CVD is a process for depositing a thin film of material onto a substrate by reacting the constituent elements from the gaseous phase on the solid surface. More specifically, a decomposable volatile compound, known as the precursor, contacts a substrate that has been heated to a temperature above which a coating or film forms on the surface of the substrate. A reactant gas may also be used in combination with the precursor.

In the low pressure chemical vapor deposition (LPCVD) of silicon nitride, a common barrier material, a chemical reaction takes place at fairly high temperatures and low pressures between ammonia ($NH_3$) and either dichlorosilane ($SiH_2Cl_2$) or silane ($SiH_4$). The ratio of ammonia to dichlorosilane or silane is typically 5:1 to 10:1. The silicon-to-nitrogen ratios in such films are ideally 0.7. Although LPCVD can produce silicon nitride films with excellent conformality, the temperature at which LPCVD is conventionally conducted, 720° C. to 800° C., makes a satisfactory but undesirable addition to the thermal budget.

In additional to LPCVD, the nitride barrier can also be deposited using plasma enhanced chemical vapor deposition (PECVD) at about 400° C. This relatively low temperature is well within the thermal budget. One significant problem with the conventional PECVD process, however, is that the barrier film produced by the process exhibits poor conformality and is thus susceptible to failure during reactive ion etching (RIE) processes needed for form the borderless contact (CB).

To overcome the shortcomings of conventional integrated circuit fabrication processes, a new process is provided for depositing a silicon nitride barrier film. An object of the present invention is to provide an improved process that deposits a highly conformal barrier film in comparison to PECVB barriers. A related object is to minimize junction leakage, which results in reduced retention time for the device. Another object of the present invention is to achieve a barrier film that is sufficiently dense to prevent dopant diffusion during the annealing steps of the integrated circuit manufacturing process and that is stable at the annealing temperatures. It is still another object to achieve a barrier film that is sufficiently permeable to hydrogen to allow passivation of surface states and dangling bonds, thereby improving device retention time. An overriding object of the present invention is to provide a process that achieves all of these beneficial properties for the barrier film while maintaining the thermal budget sufficiently low to avoid adverse impact on the device characteristics. Yet another object is to provide a barrier film that has an etch rate similar to conventional silicon nitride and, if desired, can be tuned to achieve different etching properties compared to conventional silicon nitride.

SUMMARY OF THE INVENTION

To achieve these and other objects, and in view of its purposes, the present invention provides a process for depositing an LPCVD silicon-rich silicon nitride barrier layer less than 200 Å thick with high conformality during integrated circuit manufacture. The process includes the following steps. First, the process provides ammonia and a silicon-containing gas such as, but not limited to, silane, dichlorosilane, tetrachlorosilane, and mixtures of silane and dichlorosilane. Other low-temperature precursors, such as bis(tertiarybutylamino)silane (BTBAS) and hexachlorodisilane (HCD), can be used to deposit silicon-rich compositions. The volumetric flow ratio between the ammonia and the silicon-containing gas is selected to yield atomic Si:N ratios in the resulting film of 0.7 or more. Next, the process applies a deposition temperature of between about 550° C. to 700° C. The ammonia and the silicon-containing gas are reacted at the deposition temperature to form a silicon-rich silicon nitride film. Finally, other deposition techniques like PECVD, PVD, and the like can be used to deposit films with similar chemical qualities if conformality is not a critical parameter.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 4 is a table illustrating the stoichiometric analysis by Rutherford Backscattering (RBS) of 2,000 Å LPCVD silicon-rich silicon nitride barrier films according to the process of the present invention;

DETAILED DESCRIPTION OF THE INVENTION

With the continued decrease of minimum feature sizes, typically the sizes of such features as contacts (which form bit lines and word lines) in DRAM devices also shrink. Improvements in the processes used to form such features become increasingly critical for technology development. One important structural component used in such processes of manufacture is a conformal barrier or liner film. Barrier films may provide one or more of several important functions: the barrier may act as an etch stop, block the diffusion of dopants, offer hydrogen permeability to back-end-of-line anneal gases, and provide isolation between contacts.

As a specific example, aspect ratios for the middle-of-line (MOL) etch patterns forming bit line contacts are becoming more extreme as feature dimensions are reduced. These extreme aspect ratios adversely impact the ability to deposit a barrier film. The barrier is needed to protect the fill openings during processing of insulation materials such as borophosphosilicate glass or "BPSG." In order to mitigate the aspect ratio concerns and to subsequently protect the source and drain regions and the gate stack and possibly shallow trench isolation ("STI") oxide from dopant incorporation from BPSG, a conformal barrier film is required. The barrier film also acts as an etch stop during RIE to form the bit line contact through the BPSG. The barrier film also blocks the diffusion of dopants during the BPSG anneal. Therefore, the barrier film must be reliable. In addition to these functions, the MOL barrier film must be permeable to hydrogen so that adequate retention time can be achieved during the gas annealing steps applied during the back-end-of-line ("BEOL") process steps. Most important, all of these barrier film properties must be achieved within the thermal budget, critical at the MOL stage of processing. MOL processing temperatures must be low enough to avoid changing the junction depths and, consequently, adversely affecting device performance.

Typically, silicon nitride or oxynitrides are used as the MOL barrier material. The nitrides are deposited using plasma enhanced chemical vapor deposition (PECVD) at about 400° C. This relatively low temperature is well within the thermal budget. Oxynitrides are deposited by LPCVD at temperatures greater than 700° C. and must be relatively thick in order achieve the necessary selectivity during the BPSG etch. The deposition process also produces a barrier film with about 10% hydrogen content, porous enough to assure good hydrogen diffusion properties and, therefore, good retention time results. One significant problem with this conventional process, however, is that the barrier film produced exhibits poor conformality: down to 25%. The very thin deposited nitride at the bottom of the gap between two gate contact lines erratically generates a punch through during the etch step used to create the bit line contact.

Figure 1:
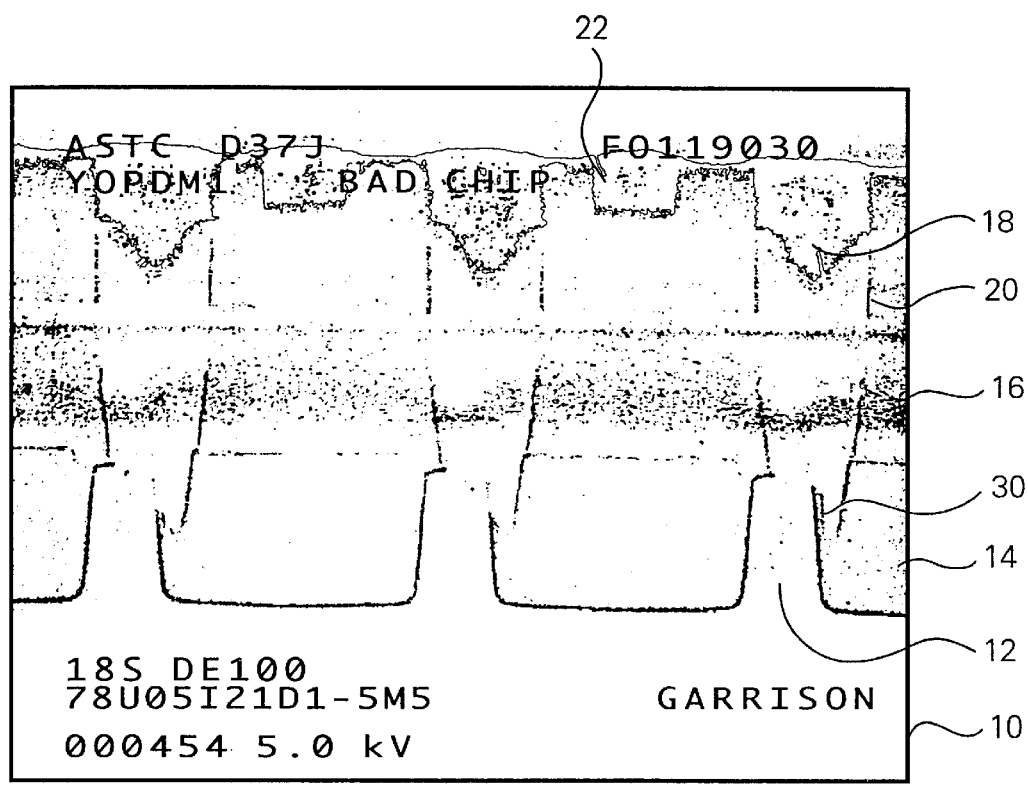
FIG. 1 is a scanning electron microscope (SEM) micrograph illustrating the damaging punch through found following the conventional manufacturing process using PECVD to apply nitride barrier films.

FIG. 1 is a scanning electron microscope (SEM) micrograph illustrating the damaging punch through found following the conventional manufacturing process using PECVD to apply nitride barrier films. From the bottom to the top of the micrograph, the silicon substrate 10 and the silicon active areas 12 are illustrated. The STI areas 14 surround active areas 12. The BPSG regions 16 isolate the bit line contacts 18 (as well as the word lines, which are not shown). An insulation layer 20 and additional contacts 22 are illustrated at the top of the micrograph. The punch through regions 30 at the bottom of each bit line contact 18 cause junction current leakage. Also noteworthy is the vertical misalignment between bit line contacts 18 and active areas 12.

Figure 2:
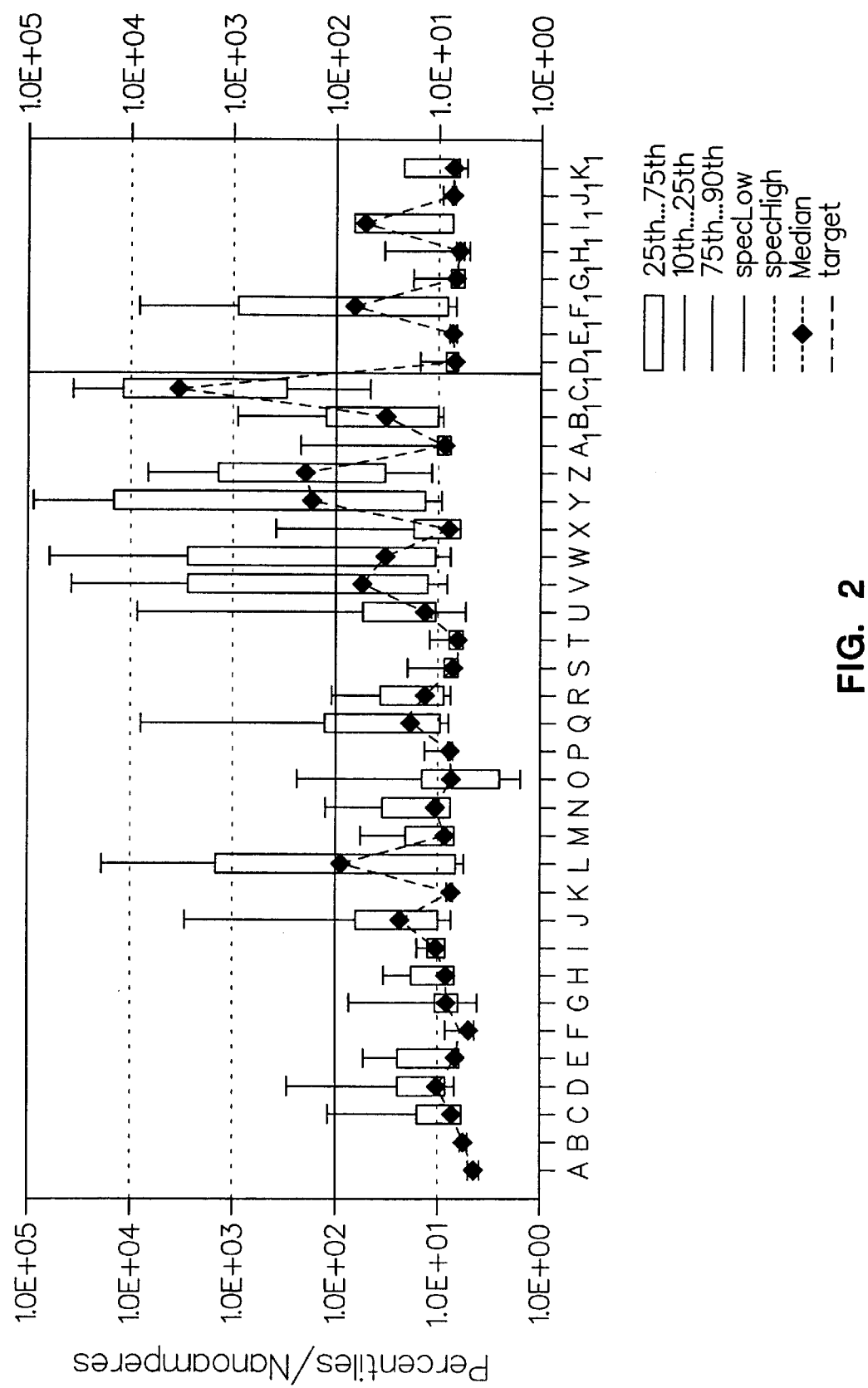
FIG. 2 is a graph of various samples showing the bit line leakage characteristics of those samples and illustrating that a significant number of samples, manufactured using the conventional process, have unacceptably high leakage current values.

The damage caused by punch through regions 30 can be detected by measuring the leakage from the bit lines. FIG. 2 is a graph of various samples showing the bit line leakage characteristics of those samples. The ordinate is measured in leakage current. The abscissa identifies the thirty-seven samples that were tested (labeled A through $K_1$). The solid horizontal line is the specification requirement for permitted leakage. Thus, a significant number of samples, manufactured using the conventional process, have unacceptably high leakage current values. Such high levels are caused by the problematic punch through illustrated physically in FIG. 1. In addition, the variation in the leakage indicates that the process has a poor window of operation.

One way to reduce the negative impact of the punch through effect is to reduce the duration of the RIE step used to create the bit line contact. Unfortunately, this possible solution introduces its own problem: the shorter etch time tends to leave BPSG insulator and may produce punch through because there is no nitride barrier to stop the RIE. The remaining bit line contact BPSG can result in electrically open bit line contacts, thereby compromising the functionality of the device.

To solve the problems inherent with the conventional PECVD process used to deposit nitride barrier films, a low-pressure CVD ("LPCVD") nitride deposition could be conducted at low temperature (720° C. or below). LPCVD films actually behave as a more reliable barrier than PECVD films because they have a higher conformality, which is appropriate for the subject process application. Simulations show that a furnace cycle at 720° C. was not a significant addition to the thermal budget. Then, with a 95% film conformality, at the proper film thickness, the punch through concern is easily solved. Unfortunately, the enhanced film quality achieved for the LPCVD film compared to the PECVD film creates another problem: the hydrogen permeability decreases for the film produced by the LPCVD process, which directly impacts the retention time.

Thus, the conventional PECVD process used to deposit nitride barrier films has a number of inherent disadvantages. Various alternatives, including a LPCVD nitride deposition conducted at 720° C. or below, were considered to overcome these disadvantages without success. The present invention solves the problems inherent in the conventional process by adopting the LPCVD technique (because the technique achieves excellent conformality) and modifying the film composition and deposition temperature for increased hydrogen permeability and reduced dopant (e.g., phosphorous and boron) diffusion.

According to the present invention, a silicon-rich silicon nitride barrier film is deposited by LPCVD. The silicon content of the barrier film, deposited using LPCVD, depends on the gas ratio and the precursor gas chemistry incorporated in the process. Common silicon nitride deposition is the result of a chemical reaction, at relatively high temperatures (600–850° C.) and low pressures, between ammonia ($NH_3$) and either dichlorosilane ($SiH_2Cl_2$) or silane ($SiH_4$), typically in the ratio of 5:1 to 10:1. There are a number of lower-temperature processes available, however, which employ BTBAS and HCD as the silicon-containing source gas. The silicon-rich compositions embodied in the present invention can also be deposited via these low-temperature precursors, with the deposition process suitably adjustable to provide the desired stoichiometry.

For example, U.S. Pat. No. 5,811,870 issued to Bhattacharyya et al. discloses a LPCVD process used to form a silicon-rich nitride injector layer of an antifuse structure. The process uses as reactants dichlorosilane ($SiH_2Cl_2$) and ammonia ($NH_3$) in a 20:1 flow ratio. The process also uses nitrogen ($N_2$) as a background gas. Other process parameters include: a 770° C. temperature, a pressure of 0.25 Torr, a 110 SCCM flow rate, and a 17 Å/min deposition rate followed by an anneal at 1,000° C. for 30 minutes. Because this process requires a high temperature, it is preferable only for front-end-of-line (FEOL) processing, where low melting point materials such as aluminum are not present in the device and junctions are not formed.

As another example, U.S. Pat. No. 4,395,438 issued to Chiang discloses a process for forming a stoichiometric silicon nitride layer (not a silicon-rich material) on a semiconductor wafer using a LPCVD process. The wafer is disposed in a closed reaction chamber evacuated to a low pressure and heated to an elevated temperature in the range of about 650 to 900° C. The interior of the chamber is supplied with a gaseous mixture of ammonia and a silicon compound adapted to react together with the ammonia at the elevated temperature to deposit a layer of silicon nitride on the wafer. The ammonia and the selected silicon compound have a ratio of relative concentrations in the mixture which is preselected to be in the range of 4:1 and 20:1. The silicon compound may be silane, dichlorosilane ("DCS"), or tetrachlorosilane. Using dichlorosilane, the preferred ratio of relative concentrations of ammonia and dichlorosilane is in the range of about 6:1 to 8:1.

It has been found that, by reducing the ratio of ammonia to the silicon compound (e.g., silane or dichlorosilane) in a LPCVD process, a continuous modulation of the silicon content of the silicon nitride film can be achieved even at relatively low temperatures within the thermal budget (i.e., 650 to 700° C.). Reduction of this ratio to about 1:20 for ammonia:DCS continuously increases the silicon content of the silicon nitride film. The ammonia:DCS ratio is preferably less than 1:1 and most preferably about 1:1.5 to 1:2. These values are well below the lower end of the conventional range (namely about 5:1). Stoichiometry can be monitored using the optical properties, in particular the refractive index ("n"), of the film or using other more elaborate methods such as Auger Electron Spectroscopy or Rutherford Backscattering (RBS).

Figure 3:
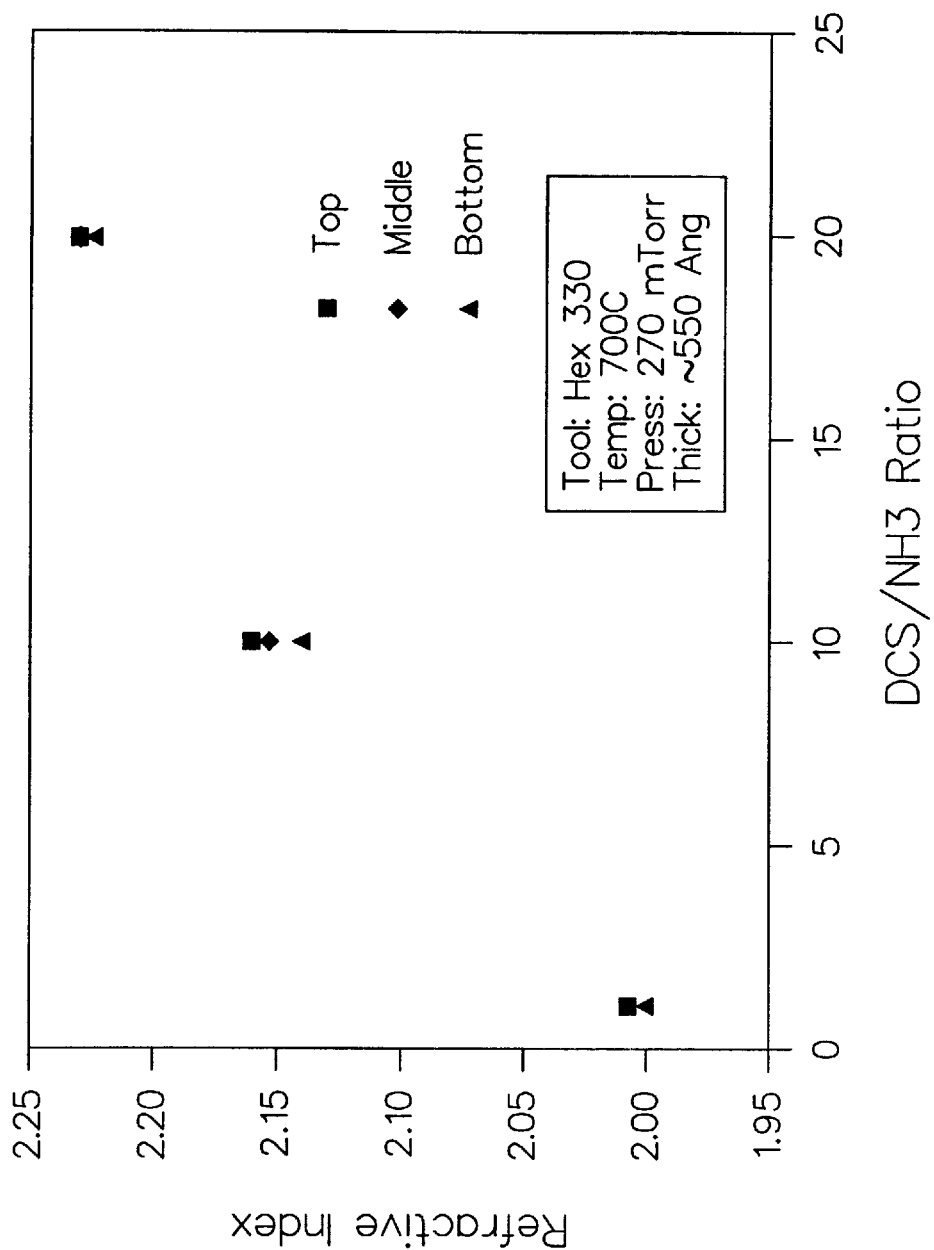
FIG. 3 is a graph of the refractive index of a silicon nitride barrier film as a function of the DCS-to-ammonia ratio at a deposition temperature of 700° C. and a deposition pressure of 270 mTorr.

FIG. 3 is a graph of the refractive index of the silicon-rich silicon nitride barrier film as a function of the DCS-to-ammonia ratio at a deposition temperature of 700° C. and a pressure of 270 mTorr. The refractive index measurements were taken using a standard HeNe laser source having a wavelength of 633 nanometers. Samples with higher refractive indices have higher atomic percentages of silicon. Armacost et al. report, in U.S. Pat. No. 5,622,596, that silicon nitride layers containing about 43 atomic percent silicon to about 60 atomic percent silicon have a refractive index that increases from 1.90 to 2.11. Stoichiometric silicon nitride ($Si_3N_4$) has about 43 atomic percent silicon. (Armacost et al. teach a process using a conventional PECVD technique to deposit the nitride.) From FIG. 3, the maximum refractive index is about 2.22. The silicon-to-nitrogen atomic ratio is approximately 1:1 as measured by RBS for the DCS/$NH_3$ ration of 20:1.

U.S. Pat. No. 5,015,353 issued to Hubler et al. discloses an apparatus and method for producing films of silicon nitride whose index of refraction varies continuously with film depth by preselected amounts between n=3.9 and n=1.99. This is achieved by varying the stoichiometry of the film. Specifically, the method produces an amorphous film of silicon nitride, $Si_{(1-x)}N_x$, of preselected substoichiometry between x=0 and x=0.57. The method is conducted at room temperature and avoids the introduction of impurities such as hydrogen. The film is used in manufacturing optical devices.

RBS analysis was conducted to further check the barrier film composition, formed according to the process of the present invention, for different process gas ratios. RBS spectrometry is a method used to determine the concentration of various elements as a function of depth beneath the surface of a sample. The method involves measuring the energy spectrum of ions which are backscattered out of a beam directed at the surface. FIG. 4 is a table compiling the results of a stoichiometric analysis of 2,000 Å LPCVD silicon-rich nitride by RBS. The results indicate the change in silicon and nitrogen composition for a number of films deposited with different DCS: ammonia ratios at 700° C. and 270 mTorr. As the DCS:ammonia ratio increases from 1:1 to above 10:1, the silicon-to-nitrogen ratio increases from about 0.7 to about 1.0 with a slight decrease in hydrogen and a slight increase in chlorine. The RBS analysis also showed uniform composition throughout the film, no difference center-to-edge, and an error of ±2%.

Figure 5:
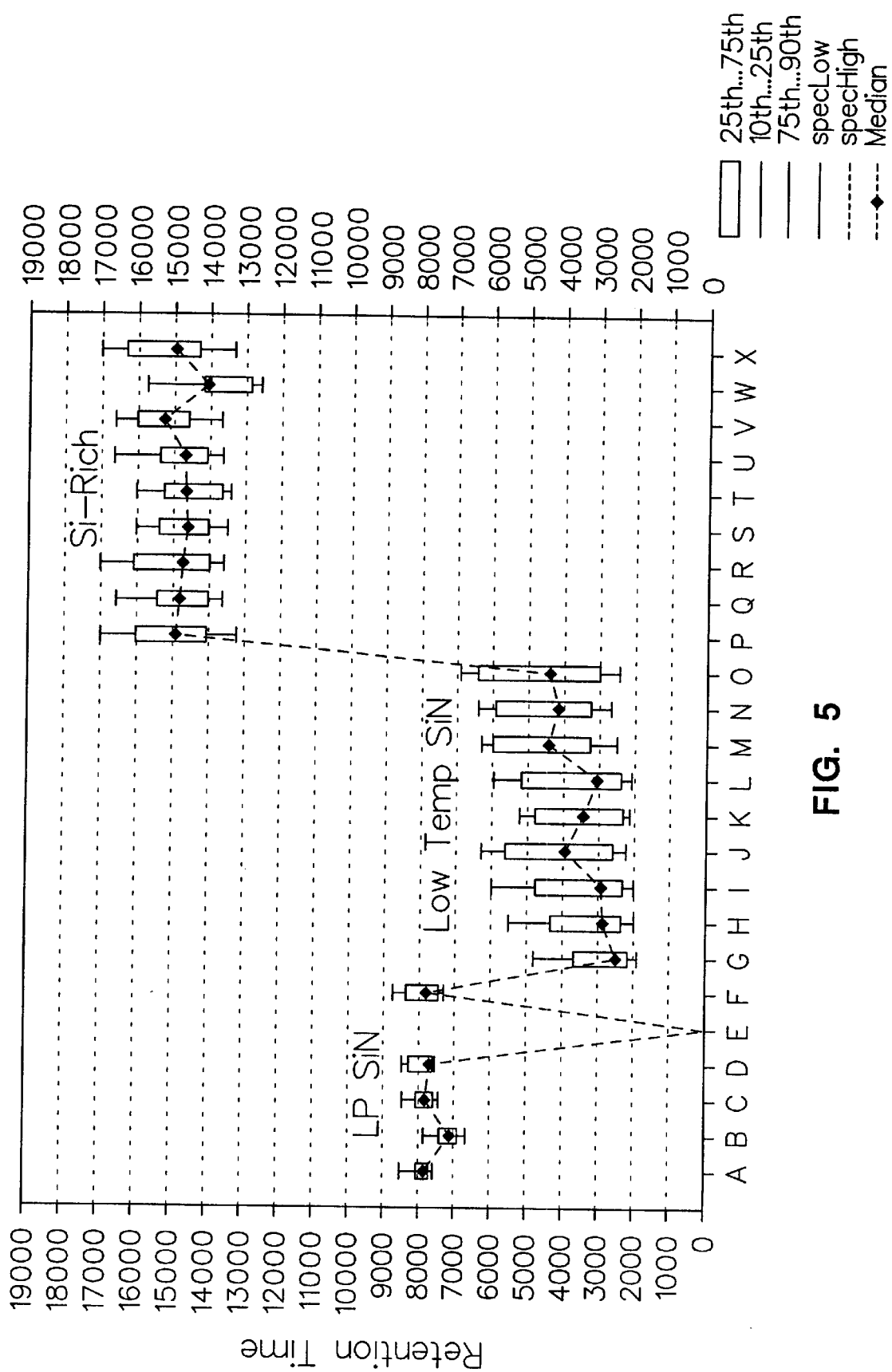
FIG. 5 is an illustration of the improvements of retention time with an increase of silicon concentration in LPCVD films (relative to stoichiometric silicon nitride) according to the process of the present invention.

A similar stoichiometric modulation can be achieved by varying the ammonia ($NH_3$) to silane ($SiH_4$) ratio or by varying the ratio of ammonia to a combination of silane and DCS. An example of the electrical benefits achieved by such a process is provided in FIG. 5. Specifically, FIG. 5 illustrates the improvement of retention time with an increase in silicon concentration ratios in LPCVD films according to the present invention. FIG. 5 also illustrates the comparable benefit of synthesizing silicon-rich films with mixtures of silane, DCS, and ammonia.

Twenty-four samples (A–X) were tested to compile the data shown in FIG. 5. Each of the samples was formed from a mixture of silane, DCS, and ammonia. Samples A through F are conventional silicon nitride layers deposited using LPCVD. Samples G through O are conventional silicon nitride layers, having a refractive index of 2.0, deposited using a low temperature process. Samples P through X are silicon-rich silicon nitride layers, having a refractive index of 2.3, deposited at 650° C. according to the LPCVD process of the present invention. An increase of 90% is shown for the layer deposited using the process of the present invention over certain conventional processes.

An added advantage of the silane and DCS combination chemistry is that it reduces the deposition temperature, and potentially increases the deposition rate depending on the gas flows, thereby positively impacting the thermal budget. A lower thermal budget improves the FET performance because the junction dopants remain in place. From a process perspective, silane-based chemistry or a combination of silane and DCS reduces the formation of $NH_4Cl$, which is a by product of the reaction between ammonia and DCS. $NH_4Cl$ is a source of particles in nitride deposition forcing the temperature to be kept high so as to sublimate the $NH_4Cl$. Silane-based nitrides are also known to contain a higher percentage of hydrogen incorporated in the barrier film, which makes them similar to PECVD silicon nitride films in composition. This characteristic may be particularly useful to achieve hydrogen diffusion during forming gas anneals for surface state passivation.

The barrier films produced by the process according to the present invention can be used in the manufacture of semiconductor devices. Such devices are used in many electronic applications including, for example, digital computers. The LPCVD process produces barrier films that have high conformality, which alleviates punch through concerns. Because of lower process temperatures, deposition does not make an unacceptable addition to the thermal budget. The thin, low-temperature, silicon-rich nitride barrier films fulfill the BPSG dopant barrier requirements. (The process can be used to achieve barrier films less than 25 nm, and down to about 7.5 nm, thick—much thinner than previously possible.) The higher selectivity of the bit line contact etch allows the silicon-rich silicon nitride barrier film to offer enhanced protection against damage to the STI areas. Deposited with suitable thicknesses and silicon-rich compositions, the barrier films have almost the same retention characteristics as current PECVD nitride barrier films, which make the new films a more attractive option.

Figure 6:
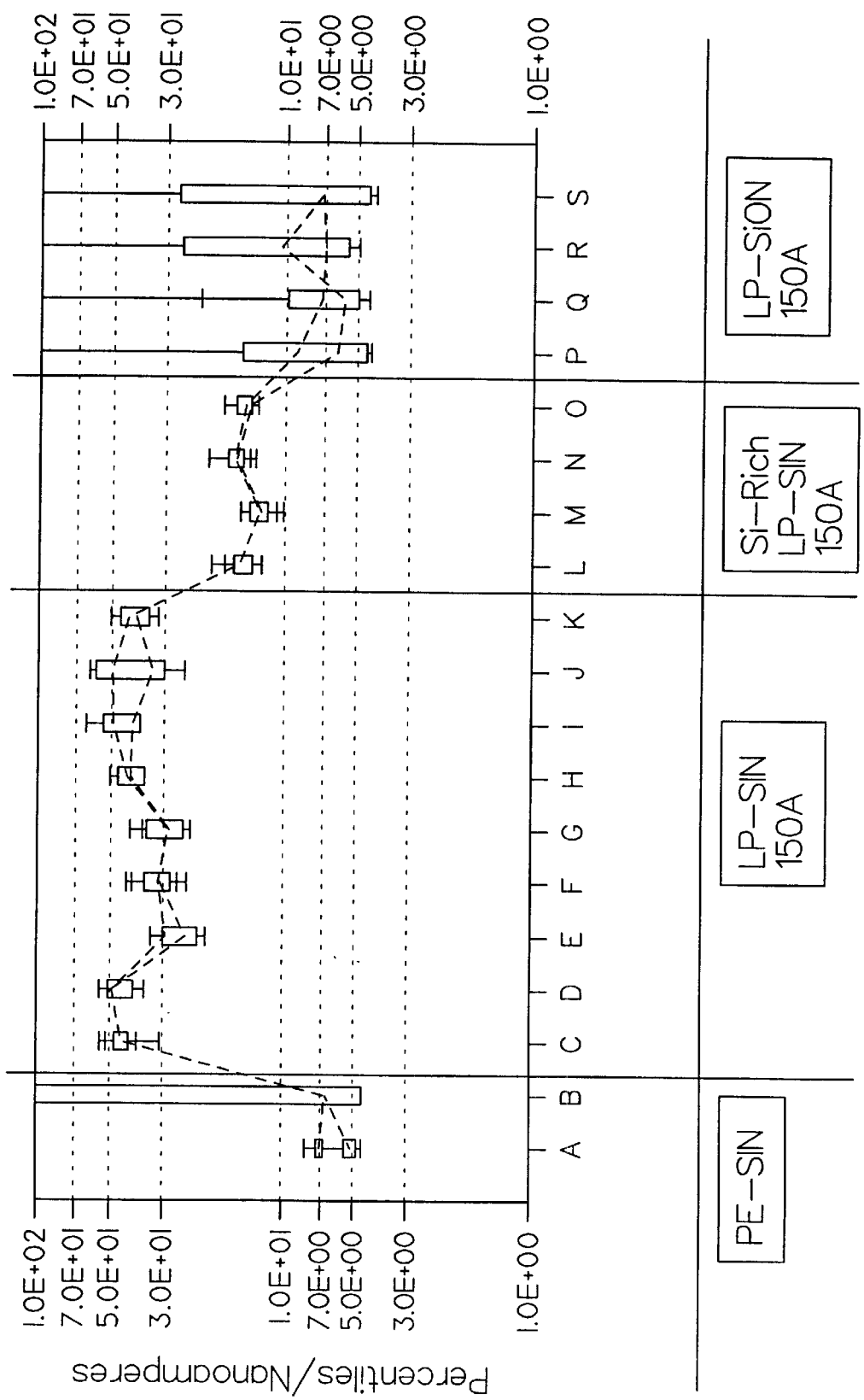
FIG. 6 is a graph of various samples showing the bit line leakage characteristics of those samples and illustrating that the barrier layers produced according to the process of the present invention reduce junction leakage relative to conventional barrier layers.

FIG. 6 is a graph of various samples showing the bit line leakage characterization of those samples. The ordinate is measured in percentiles/nanoamperes. The abscissa identifies the nineteen samples that were tested (labeled A through S). Samples A and B are conventional silicon nitride layers deposited using PECVD. Samples C through K are conventional silicon nitride layers deposited using LPCVD. Samples L through O are silicon-rich silicon nitride layers deposited according to the LPCVD process of the present invention. Finally, samples P through S are silicon oxynitride layers.

Figure 7:
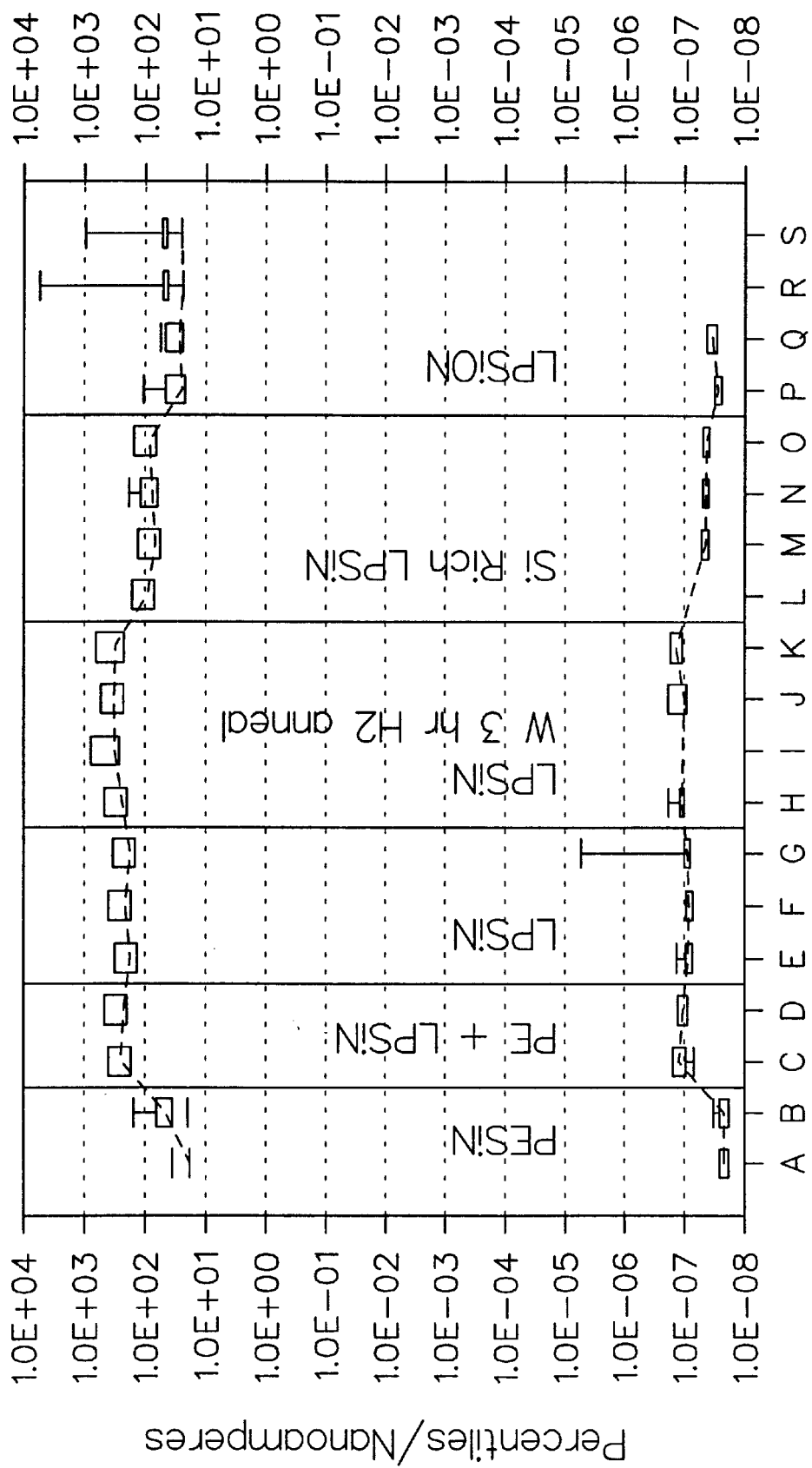
FIG. 7 is a graph of various samples showing the bit line leakage characteristics of those samples both at M0 (the first metal line) and at final test and illustrating the effectiveness of the barrier layers produced according to the process of the present invention in reducing induced leakage at M0 and at final test relative to conventional barrier layers.

FIG. 7 shows the difference injunction leakage current measured for the different barrier materials. Conventional silicon nitride layers (samples C through K) deposited using LPCVD have a higher leakage current than do conventional silicon nitride layers deposited using PECVD (samples A and B), a result caused by less termination of interface states with hydrogen. On the other hand, the barrier layers produced according to the process of the present invention reduce junction leakage because they allow hydrogen to easily diffuse through the barrier layers.

FIG. 7 is a graph of various samples showing the bit line leakage characterization of those samples both at M0 (the first metal line) and at final test. The ordinate is measured in percentiles/nanoamperes. The abscissa identifies the nineteen samples that were tested (labeled A through S). Samples A and B are conventional silicon nitride layers deposited using PECVD. Samples C and D are conventional silicon nitride layers deposited using PE and LPCVD. Samples E, F, and G are conventional silicon nitride layers deposited using LPCVD. Samples H through K are conventional silicon nitride layers deposited using LPCVD, followed by a three-hour hydrogen anneal. Samples L through O are silicon-rich silicon nitride layers deposited according to the LPCVD process of the present invention. Finally, samples P through S are silicon oxynitride layers deposited according to the LPCVD process of the present invention.

FIG. 7 shows the effectiveness of the silicon-rich silicon nitride barrier layer, deposited according to the LPCVD process of the present invention, compared to the conventional silicon nitride layers deposited using LPCVD in reducing induced leakage at M0 and at final test. The silicon-rich silicon nitride barrier layer, deposited according to the LPCVD process of the present invention, essentially gives leakages similar to the conventional barrier layer choices for MOL liners. FIG. 7 also shows that an extended hydrogen anneal cannot anneal the surface states effectively.

The advantages of the silicon-rich silicon nitride barrier layer deposited according to the LPCVD process of the present invention are many. The barrier layer produced is highly conformal, as opposed to conventional barrier films, providing excellent protection against RIE punch through. In addition to conformality, the barrier films are sufficiently dense to prevent dopant and oxidation punch through during the BPSG anneal and are stable at the anneal temperatures. The barrier films are sufficiently permeable to hydrogen to allow passivation of surface states and dangling bonds to improve device retention time. All of these beneficial properties for the barrier films are achieved while maintaining the thermal budget sufficiently low to avoid adverse impact on the device characteristics.

The off-stoichiometric silicon-rich silicon nitride can be deposited and the stoichiometry can be tuned easily. The silicon-rich silicon nitride barrier layer also provides improved selectivity during the RIE step forming the bit line contacts, improving the process window, tolerance, and, consequently, yield. Finally, by varying the stoichiometry of the silicon nitride, the etch rate (dry as well as wet) of the silicon nitride can be varied to suit the integration scheme.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process for depositing a silicon nitride film as a barrier layer with high conformality during integrated circuit manufacture, the process comprising:

providing ammonia and a silicon-containing gas wherein the ratio of the volume of ammonia to the volume of the silicon-containing gas is about 1:1 to about 1:20;

applying a deposition temperature of 550° C. to 720° C.;

reacting the ammonia with the silicon-containing gas at the deposition temperature to form the silicon nitride film; and depositing the silicon nitride film by low pressure chemical vapor deposition.

2. The process of claim 1 wherein the silicon-containing gas is dichlorosilane.

3. The process of claim 1 wherein the silicon-containing gas is silane.

4. The process of claim 1 wherein the silicon-containing gas is a mixture of silane and dichlorosilane.

5. The process of claim 1 wherein the ammonia and silicon-containing gas are provided in a ratio of about 1:1.

6. The process of claim 1 wherein the silicon nitride film is off-stoichiometric silicon-rich silicon nitride.

7. The process of claim 6 wherein the deposition temperature is between 650° C. to 700° C.

8. The process of claim 7 wherein the deposition temperature is about 700° C.

9. The process of claim 1 wherein the silicon-containing gas is selected from the group consisting of silane, dichlorosilane, and mixtures thereof.

10. The process of claim 9 wherein the deposition temperature is about 700° C.

11. The process of claim 1 wherein the silicon nitride film is deposited with a conformality of about 95%.

12. The process of claim 1 wherein the silicon nitride film as deposited is permeable to hydrogen.

13. The process of claim 1 wherein the silicon nitride film as deposited is sufficiently dense to prevent dopant diffusion during an annealing step of the integrated circuit manufacturing process and is stable at annealing temperatures.

14. The process of claim 1 wherein the silicon-containing gas is selected from the group consisting of bis(tertiarybutylamino)silane and hexachlorodisilane.

15. The process of claim 14 wherein the deposition temperature is about 700° C.

16. A process for depositing an off-stoichiometric silicon-rich silicon nitride film as a barrier layer during integrated circuit manufacture, the process comprising:

providing ammonia and a silicon-containing gas selected from the group consisting of silane, dichlorosilane, bistertiarybutylaminosilane, hexachlorodisilane, and mixtures thereof, wherein the ratio of the Si to N in the resulting film is greater than 0.7;

applying a deposition temperature of 550° C. to 700° C.;

reacting the ammonia with the silicon-containing gas at the deposition temperature to form the off-stoichiometric silicon-rich silicon nitride film; and depositing the silicon nitride film by low pressure chemical vapor deposition with a conformality of about 95%.

17. The process of claim 16 wherein the deposition temperature is between 650° C. to 700° C.

18. The process of claim 17 wherein the deposition temperature is about 700° C.

19. The process of claim 16 wherein the silicon nitride film as deposited is permeable to hydrogen; is sufficiently dense to prevent dopant diffusion during an annealing step of the integrated circuit manufacturing process; and is stable at annealing temperatures.

* * * * *

UNITED STATES PATENT AND TRADEMARK OFFICE
CERTIFICATE OF CORRECTION

PATENT NO.    : 6,268,299 B1
DATED         : July 31, 2001
INVENTOR(S)   : Rajarao Jammy et al.

It is certified that error appears in the above-identified patent and that said Letters Patent is hereby corrected as shown below:

<u>Title page, Item [54], and Column 1, line 4,</u>
Delete "HYROGEN" and insert -- HYDROGEN --

Signed and Sealed this

Fourth Day of June, 2002

Attest:

Attesting Officer

JAMES E. ROGAN
*Director of the United States Patent and Trademark Office*